United States Patent [19]

Eriguchi et al.

[11] Patent Number: 5,583,320

[45] Date of Patent: Dec. 10, 1996

[54] REINFORCEMENT FOR FLEXIBLE PRINTED CIRCUIT BOARD AND REINFORCED FLEXIBLE PRINTED CIRCUIT BOARD

[75] Inventors: Fuyuki Eriguchi; Toshihiko Sugimoto; Seiichi Watanabe, all of Osaka, Japan

[73] Assignee: Nitto Denko Corporation, Osaka, Japan

[21] Appl. No.: 412,452

[22] Filed: Mar. 29, 1995

[30] Foreign Application Priority Data

Mar. 30, 1994 [JP] Japan .................................. 6-085672

[51] Int. Cl.⁶ .................................................. H05K 1/02
[52] U.S. Cl. ...................... 174/254; 361/749; 174/255
[58] Field of Search .................................. 174/250, 254, 174/255; 361/749, 785, 792, 795; 439/67, 77

[56] References Cited

U.S. PATENT DOCUMENTS 5,095,628  3/1992  Mckenney et al. ........................ 29/846
5,262,594  11/1993  Edwin et al. ............................ 174/254
5,426,568  6/1995  Lamers et al. ........................... 361/810
5,450,286  9/1995  Jaques et al. ........................... 361/749
5,468,917  11/1995  Brodsky et al. ......................... 174/255
5,493,074  2/1996  Murata et al. ........................... 174/254

*Primary Examiner*—Laura Thomas
*Attorney, Agent, or Firm*—Sughrue, Mion, Zinn, Macpeak & Seas

[57] ABSTRACT

A reinforcement for a flexible printed circuit board, which can sufficiently prevent the flexible printed circuit board thus reinforced from being warped when heated during the assembly process of electronic components or other procedures. The reinforcement according to the present invention is used to adhere to a flexible printed circuit board 1. The reinforcement according to the present invention comprises an internal material 21 having a bending neutral surface at the center of the thickness thereof, and an external material 22 having the same Young's modulus as that of an insulating substrate 11 of the flexible printed circuit board 1, bonded to one side of the internal material 21. The other side of the internal material 21 acts as an adhesive surface to the flexible printed circuit board 1.

24 Claims, 2 Drawing Sheets

5,583,320

REINFORCEMENT FOR FLEXIBLE PRINTED CIRCUIT BOARD AND REINFORCED FLEXIBLE PRINTED CIRCUIT BOARD

FIELD OF THE INVENTION

The present invention relates to a reinforcement for a flexible printed circuit board and a flexible printed circuit board reinforced with such a reinforcement.

BACKGROUND OF THE INVENTION

Some flexible printed circuit boards have a conductor circuit pattern printed on a flexible insulating substrate, and a plastic film having a thickness of about 25 to 125 μm is used as such an insulating substrate. Depending on the working conditions, a reinforcement is adhered to the insulating substrate to provide a mechanical reinforcement.

However, if the CTE (Coefficient of Thermal Expansion) of the reinforcement material differs from that of the insulating substrate for a printed circuit board, the difference of the CTE causes mechanical stress between two layers which warps the printed circuit board, resulting in troubles in the assembly of electronic components such as ICs. Accordingly, the reinforcement material should be selected from the materials which have the same or close CTE as that of the insulating substrate.

However, the inventors' experience shows that even a flexible printed circuit board reinforced with a reinforcement having the same material as that of the insulating substrate used causes warp when heated. If the printed circuit board is large sized, the warpage is also so large that the electronic components can hardly be assembled.

It can be presumed that the warp occurs by a bending moment M produced when a residual stress occurring in the interface of the printed circuit board with the reinforcement at a position apart from the center of the thickness of the laminate (printed circuit board to which the reinforcement has been adhered) is relaxed upon heating (M=f·t wherein t is a distance between the position at which the residual stress occurs and the center of the thickness of the laminate and f is a residual stress).

SUMMARY OF THE INVENTION

Accordingly, an object of the present invention is to provide a reinforcement which is adhered to flexible printed circuit boards, which can sufficiently prevent the flexible printed circuit board from warpage when heated during the assembly of electronic components or other manufacturing processes.

The reinforcement for a flexible printed circuit board is used to adhere to a flexible printed circuit board. The reinforcement of the present invention comprises an internal material having a bending neutral surface located at the center of the thickness thereof, and an external material having the same Young's modulus (difference in Young's modulus: ±20% or less, preferably ±10% or less) as that of an insulating substrate of the flexible printed circuit board, which is bonded to one side of the internal material, the other side of the internal material acting as an adhesive surface to the flexible printed circuit board. The internal material may have a single-layer or multi-layer construction. The external material may be made of the same material as that of the insulating substrate of the flexible printed circuit board. Alternatively, the external material may have the same material and thickness as that of the insulating substrate of the flexible printed circuit board. Further, the external material may be made of the same material as that of the insulating substrate of the flexible printed circuit board and have a thickness different from that of the insulating substrate of the flexible printed circuit board, the ratio of the thickness of the external material to that of the insulating substrate being from 1:5 to 5:1.

DETAILED DESCRIPTION OF THE INVENTION

Figure 1:
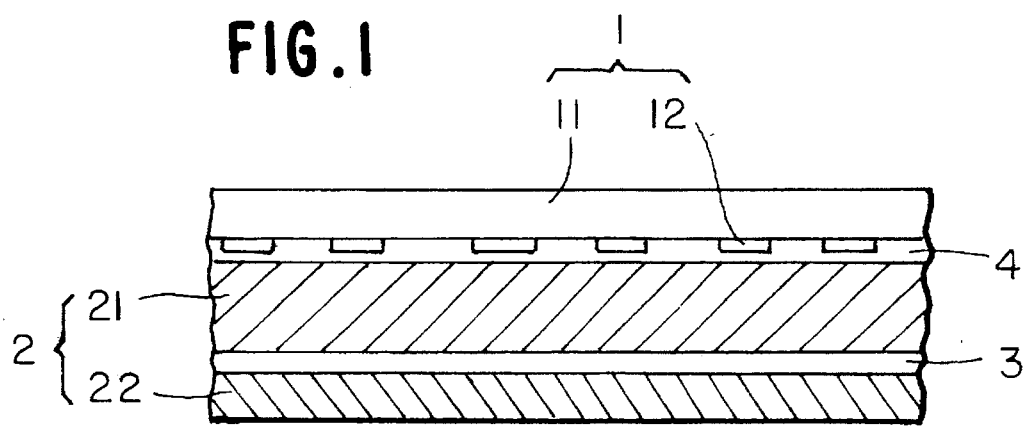
FIG. 1 is an illustrative view showing a flexible printed circuit board reinforced with a reinforcement according to one embodiment of the present invention.

The term "bending neutral surface" used herein means a surface which does not cause elongation or shrinkage when a material having a certain thickness (e.g., a sheet-like material) is bent.

Further, the reinforced flexible printed circuit board according to the present invention comprises a flexible printed circuit board, an internal material, and an external material, in this order. Therefore, the internal material is located at the side of the flexible printed circuit board.

The constitution of the present invention will be described below by referring to the drawings.

FIG. 1 is an illustrative view showing a reinforced flexible printed circuit board having one embodiment of the reinforcement according to the present invention adhered thereon.

In FIG. 1, 1 is a flexible printed circuit board having a conductor circuit pattern 12 printed on one or both sides of a flexible insulating substrate 11. The insulating substrate used can be any appropriate flexible insulating substrate. Examples of the flexible insulating substrate include a polyimide film, a polyether nitrile film, a polyether sulfone film, a polyester film (e.g., a polyethylene terephthalate film), a polyethylene film, a polypropylene film, and a polyvinyl chloride film. Examples of the conductor material which can be used are a metal foil such as copper foil, an electrically conductive paste, an evaporated metal, and the like.

A circuit pattern printing method which can be used is the conventional method. Examples thereof are a method which comprises photoetching a copper foil (normally having a thickness of 18 μm or 35 μm) on a copper-clad laminate insulating substrate, a method which comprises screen-printing an electrically conductive paste, and the like.

The flexible printed circuit board 1 may have a multilayer construction.

In FIG. 1, 2 is a reinforcement according to the present invention. The reinforcement comprises an internal material 21 having a bending neutral surface positioned at the center of the thickness thereof, and an external material 22 having the same or almost the same Young's modulus as that of the insulating substrate 11, bonded with an adhesive 3 to one side of the internal material 21. The internal material 21 is bonded with an adhesive 4 to the flexible printed circuit board 1 on the other side thereof.

Examples of the external material having the same or almost the same Young's modulus as that of the insulating substrate, which can be used, are a polyimide film, a polyether nitrile film, a polyether sulfone film, a polyethylene terephthalate film, and the like. The insulating substrate and the external material may be the same or different.

The most preferred embodiment is that the insulating substrate 11 of the flexible printed circuit 1 and the external material 22 have the same material, e.g., a polyimide film, a polyethylene terephthalate film, etc.

The thickness of the reinforcement 2 is generally from 0.5 to 200 times, and preferably from 1 to 20 times, that of the insulating substrate 11 of the flexible printed circuit board 1.

The thickness of each of the insulating substrate of the flexible printed circuit board, the internal material and the external material is generally from 12.5 to 500 µm.

The bonding of the internal material 21 to the external material 22 in the reinforcement 2 and the bonding of the reinforcement 2 to the printed circuit board 1 may be accomplished by the same or different bonding methods. The bonding method which can be used is a method of heat pressing the laminate using a thermosetting adhesive or thermoplastic adhesive, a method of pressing the laminate using a pressure-sensitive adhesive, or the like. The thickness of the adhesive layer is generally from 12.5 to 70 µm.

The thermosetting adhesive and thermoplastic adhesive are generally solvent type adhesive and thus are in the form of solution of a solid content dissolved in an organic solvent. Accordingly, the bonding of the internal material to the external material (or the printed circuit board) can be accomplished by, for example, a method which comprises applying a thermosetting adhesive containing an organic solvent to both sides of the internal material, volatilizing the organic solvent to form an adhesive layer generally having a thickness of from 12.5 to 70 µm, and then bonding the external material (or the printed circuit board) to the surface of the adhesive layer by hot pressing or other means, as shown in FIG. 1.

The thermosetting adhesive which can be used is an epoxy rubber adhesive obtained by dissolving a mixture of an epoxy resin and rubber in an organic solvent. The thermoplastic adhesive which can be used is an organic solvent type synthetic rubber adhesive (e.g., Elep coat LSS-520: liquid insulating sealant available from Nitto Denko Corp.). The pressure-sensitive adhesive which can be used is an acrylic adhesive which is applied to both sides of a supporting substrate.

Where the thermosetting adhesive or the thermoplastic adhesive is a solvent type adhesive, its solid content is generally from about 25 to 50% by weight.

Figure 2A:
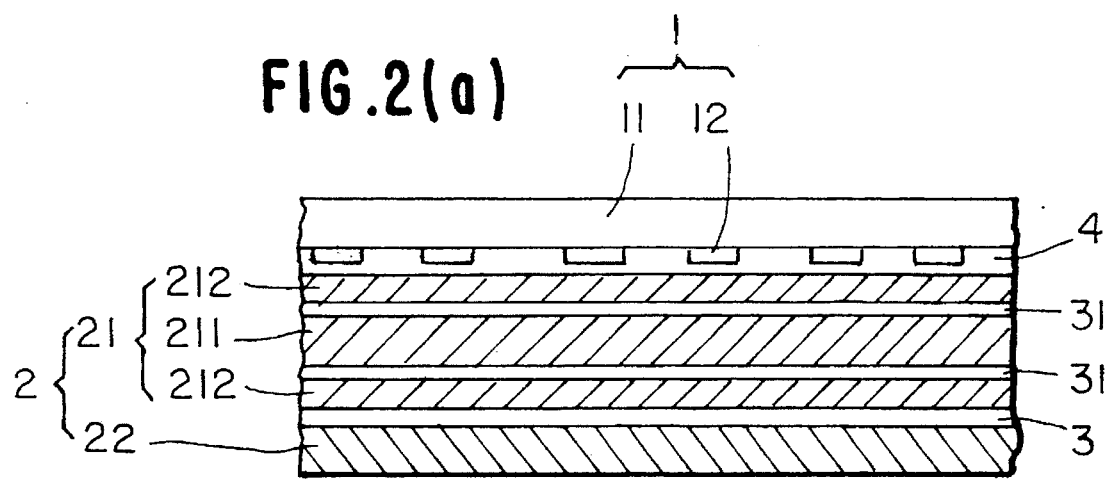
FIG. 2(a) is an illustrative view showing a flexible printed circuit board reinforced with a reinforcement according to another embodiment of the present invention, wherein an internal material of the reinforcement is made of odd numbers of layers.

The internal material 21 may have a single-layer construction as in the reinforcement for the reinforced printed circuit board shown in FIG. 1, and also may have a multilayer construction as in the reinforcement for the reinforced flexible printed circuit board shown in FIGS. 2(a) and (b).

In FIG. 2(a), a reinforcement 2 comprises an internal material 21 having a central film 211 to which films 212, 212 are bonded to the respective side thereof. The two films 212 may comprise the same material and have the same thickness. The film 212 and the central film 211 may comprise different materials and have different thicknesses. The adhesive 31 between these layers (formed by heating under pressure using a thermosetting resin or a thermoplastic resin, pressing using a pressure-sensitive adhesive, or like methods) and the adhesive 3 between the internal material 21 and the external material 22 may be formed by the same or different methods. In another embodiment, the internal material may have a multi-layer construction comprising three or more odd-numbered ($2n+1$) layers, the n-th (n=1, 2, 3, ...) layers upward and downward from the central layer comprising the same material and having the same thickness. These layers each may be the same as or different from the central layer in material and thickness. In FIG. 2(a), the reference numeral 1 indicates a flexible printed circuit as in FIG. 1.

Figure 2B:
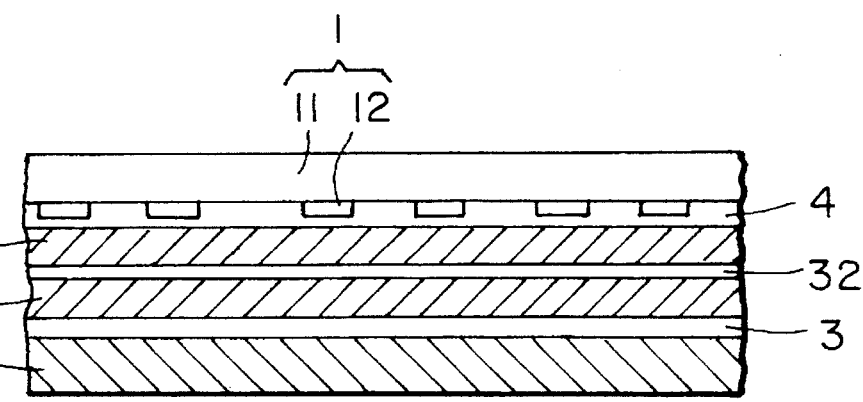
FIG. 2(b) is an illustrative view showing a flexible printed circuit board reinforced with a reinforcement according to further embodiment of the present invention, wherein an internal layer of the reinforcement is made of even numbers of layers.

In FIG. 2(b), a reinforcement 2 comprises an internal material 21 to which films 213, 213 having the same material and thickness have been bonded. The adhesive 32 between these layers (formed by heating under pressure using a thermosetting resin or thermoplastic resin, pressing using a pressure-sensitive adhesive, or like methods) and the adhesive 3 between the internal material 21 and the external material 22 may be formed by the same or different methods. In another embodiment, the internal material may have a multi-layer construction comprising two or more even-numbered ($2n$) layers, the n-th (n=1, 2, 3, ...) layers upward and downward from the central adhesive layer comprising the same material and having the same thickness. In FIG. 2(b), the reference numeral 1 indicates a flexible printed circuit as above.

The material of the internal material 21 may be the same or different from that of the external material 22 so long as the requirement that the bending neutral surface is located at the center of the thickness can be met. The material can be appropriately selected from polyimide film, polyether nitrile film, polyether sulfone film, polyethylene terephthalate film, polyethylene film, polypropylene film, polyvinyl chloride film, etc.

An adhesive (thermosetting adhesive, thermoplastic adhesive or pressure-sensitive adhesive) may be applied to the other surface of the internal material 21 (surface to be bonded to the flexible printed circuit board 1), and then dried prior to the above procedure.

Figure 3:
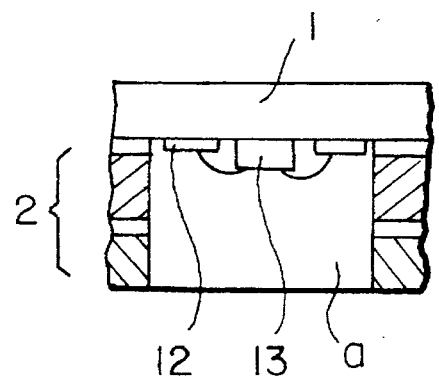
FIG. 3 is an illustrative view showing an embodiment of the assembled construction of a electronic component on a flexible printed circuit board reinforced with a reinforcement of the present invention.

If the flexible printed circuit board 1 is a single-sided printed circuit board, the reinforcement may be adhered to the flexible printed circuit board 1 on the printed surface or the other surface thereof. If the reinforcement 2 is adhered to the printed surface 12 of the printed circuit board 1 as shown in FIG. 3, the reinforcement 2 may be provided with a hole a for accommodating electronic components so that an electronic component 13 can be assembled in the hole a.

Figure 4A:
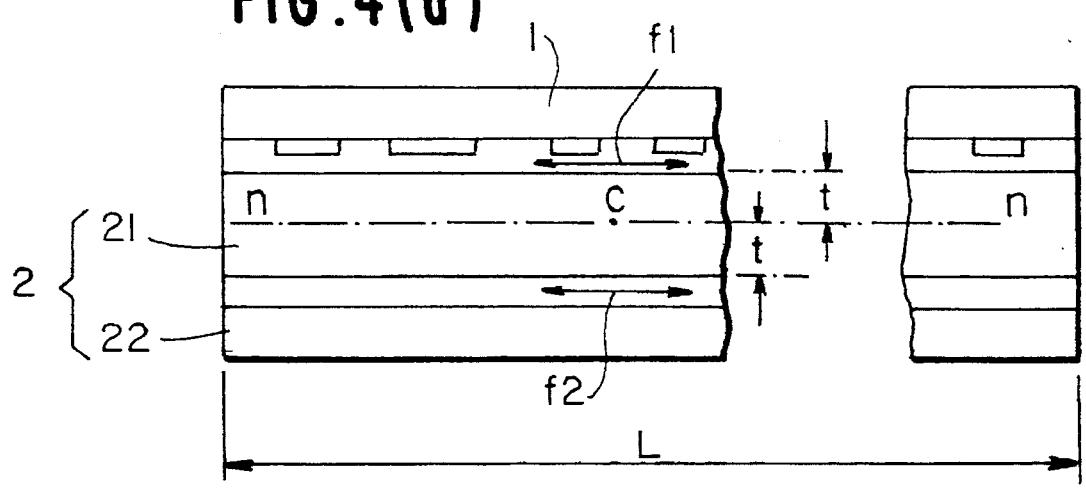
FIGS. 4(a) and 4(b) are illustrative views showing different dynamic conditions to the warpage of a flexible printed circuit board reinforced with a reinforcement of the present invention.

As shown in FIG. 4(a), residual stresses $f_1$ and $f_2$ act on the adhesion interface between the flexible printed circuit board 1 and the reinforcement 2 and also the adhesion interface between the internal material 21 and the external material 22 in the reinforcement 2, respectively. Probably, these residual stresses are mainly caused by the following mechanism. That is, the material is elongated up to the elastic limit when pressed during the lamination process. This elongation is fixed by adhesion. Thus, a tensile stress remains due to the elastic elongation thus fixed.

Accordingly, when the reinforced flexible printed circuit board is heated to relax the residual stresses $f_1$ and $f_2$ (probably because the heat makes the adhesive too soft to maintain the residual stresses), a bending moment M occurs.

However, if the flexible printed circuit board 1 and the external material 22 are the same in Young's modulus and thickness, the bending neutral surface n—n of the reinforced flexible printed circuit board to the bending moment corresponds to the center c of the thickness of the internal material 21. Supposing that the thickness of the internal material 21 is 2t, the bending moment M is given by the following equation:

$$M=(f_1-f_2)t \quad (1)$$

Supposing that the bending stiffness of the reinforced flexible printed circuit board is EI, the bending radius of the reinforced flexible printed circuit board by the bending moment M is given by the following equation:

$$1/r=M/EI \quad (2)$$

Supposing that the length of the reinforced flexible printed circuit board is L, the warpage h (deflection at the center of the width) is given by the following equation:

$$h=L^2/8r=L^2M/(8EI)=L^2(f_1-f_2)t/(8EI) \quad (3)$$

If the flexible printed circuit board 1 and the external material 22 are the same in Young's modulus and thickness, the residual stresses $f_1$ and $f_2$ are almost the same due to the above-described mechanism. Accordingly, it can be seen in the equation that the warpage of the reinforced flexible printed circuit board is almost zero.

Figure 4B:
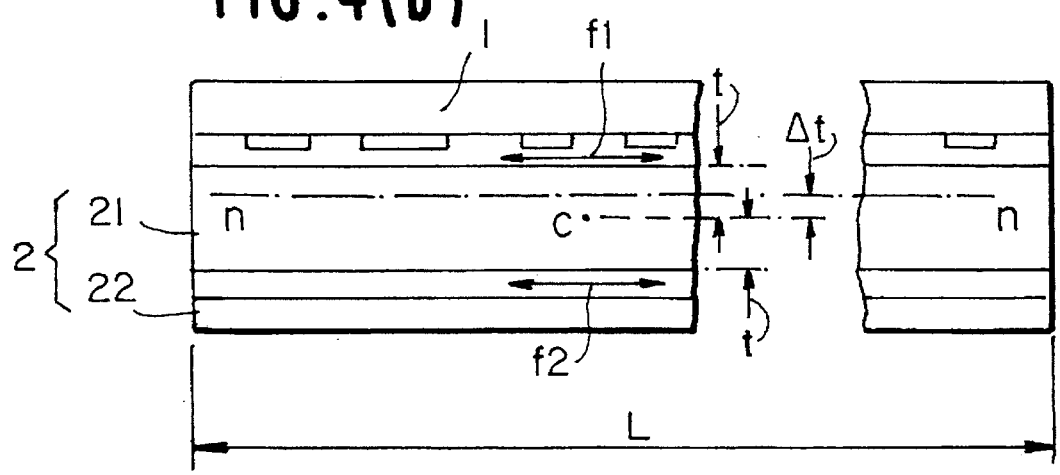

Further, if the external material 22 has a smaller Young's modulus or thickness than the flexible printed circuit board 1, the bending neutral surface n—n of the reinforced flexible printed circuit board deviates from the center c of the internal material 21 towards the flexible printed circuit board 1 (deviation Δt) and the residual stress $f_2$ is smaller than the residual stress $f_1$ ($f_2<f_1$), as shown in FIG. 4(b). In this case, the bending moment M' is given by the following equation:

$$M'=f_1(t-\Delta t)-f_2(t+\Delta t)=(f_1-f_2)t-\Delta t(f_1+f_2) \quad (4)$$

In this case, too, the bending moment can be reduced from that developed when $f_2$ is zero, i.e., the reinforcement 2 has a single-layer construction free of the generation of residual stress $f_2$ (corresponding to the prior art), resulting in the reduction of the warpage produced according to the above-described mechanism.

Accordingly, even if an insulating substrate having a smaller Young's modulus than the flexible printed circuit board is used as an external reinforcement material, and even if an insulating substrate having a thickness of 1 to ⅕ times that of the insulating substrate is used as an external reinforcement material, the warpage produced according to the above-described mechanism can be further reduced as compared with the prior art. This can be proved by the comparison between the following examples and comparative examples.

Further, if the thickness of the external material is greater than that of the flexible printed circuit board, the bending neutral surface of the reinforced flexible printed circuit board deviates from the center of the thickness of the internal material towards the external material (Δt is negative in the equation (4)), and the residual stress $f_2$ is greater than that developed in FIG. 4(b), resulting in a further reduction of the warpage produced according to the above-described mechanism. Accordingly, even if a reinforcement having a thickness of 1 to 5 times that of the insulating substrate of the flexible printed circuit board is used as an external reinforcement material, the warpage produced according to the above-described mechanism can be further reduced as compared with the prior art. This can be proved by Example 5.

The present invention will be further described in the following examples, but the present invention should not be construed as being limited thereto.

The flexible printed circuit board used hereinafter was obtained by laminating a 35-μm thick copper foil on a 125-μm thick polyethylene terephthalate film (insulating substrate), and then photoetching the laminate to form a circuit pattern thereon (percentage of retention of copper foil: approx. 10 This flexible printed circuit board had a length of 300 mm and a width of 130 mm.

EXAMPLE 1

In the construction shown in FIG. 1, a polyethylene terephthalate film having a thickness of 350 μm was used as an internal material 21. The internal material 21 was coated with an organic solvent type synthetic rubber adhesive (Elepcoat LSS-520: liquid insulating sealant available from Nitto Denko Corp.) on both sides thereof. The coating film was then dried. Separately, a polyethylene terephthalate film having a thickness of 125 μm, which is the same as that of an insulating substrate 11 of a flexible printed circuit board 1, was provided as an external material 22. The external material 22 was then hot-pressed to the synthetic rubber adhesive surface of the internal material 21 on one side thereof at a temperature of 70° C. under a pressure of 5 kg/cm² by means of a heated roller to obtain a reinforcement 2. During this process, the adhesive layer on the other side of the internal material 21 was protected by a silicone-treated polyester film. The reinforcement 2 was then provided with holes for accommodating electronic components. The silicone-treated polyester film was then peeled off the internal material 21. The printed surface of the flexible printed circuit board 1 was then hot-pressed to the synthetic rubber adhesive surface of the internal material 21 of the reinforcement 2 on the other side thereof at a temperature of 70° C. under a pressure of 30 kg/cm² for 1 minute.

In FIG. 1, both the adhesive layers 3 and 4 had a thickness of 25 μm.

EXAMPLE 2

In the construction shown in FIG. 2(b), the upper film of 150-μm thick polyethylene terephthalate films 213, 213 was coated with the same organic solvent type synthetic rubber adhesive as used in Example 1 above on both sides thereof. The coating film was then dried. On the other hand, the lower film was coated with the same organic solvent type synthetic rubber adhesive as used in Example 1 on one side thereof (lower side). The coating film was then dried. As an external material 22 there was used a 125-μm thick polyethylene terephthalate film, whose thickness and material were the same as that of the insulating substrate of the flexible printed circuit board 1. These three layers were then laminated and heat-bonded at a temperature of 70° C. under a pressure of 5 kg/cm² by means of a heated roller to obtain a reinforcement 2. During this process, a silicone-treated polyester film was used in the same manner as in Example 1. The reinforcement 2 was then provided with holes for accommodating electronic components. The silicone-treated polyester film was then peeled off the internal material 21. The printed surface of the flexible printed circuit board 1 was then hot-pressed to the synthetic rubber adhesive surface of the internal material 21 of the reinforcement 2 on the other side thereof at a temperature of 70° C. under a pressure of 30 kg/cm² for 1 minute.

In FIG. 2(b), all the adhesive layers 3, 32 and 4 had a thickness of 25 μm.

EXAMPLE 3

In the construction shown in FIG. 1, a polyimide film having a thickness of 150 μm was used as an internal material 21. The internal material 21 was coated with the same organic solvent type synthetic rubber adhesive as used in Example 1 above on both sides thereof. The coating film was then dried. Separately, a polyethylene terephthalate film having a thickness of 125 μm, which is the same as that of an insulating substrate 11 of a flexible printed circuit board 1, was provided as an external material 22. The external material 22 was then hot-pressed to the synthetic rubber adhesive surface of the internal material 21 on one side thereof at a temperature of 70° C. under a pressure of 5 kg/cm² by means of a heated roller to obtain a reinforcement 2. During this process, the adhesive layer on the other side of the internal material 21 was protected by a silicone-treated polyester film. The reinforcement 2 was then provided with holes for accommodating electronic components. The silicone-treated polyester film was then peeled off the internal material 21. The printed surface of the flexible printed circuit board 1 was then hot-pressed to the synthetic rubber adhesive surface of the internal material 21 of the reinforcement 2 on the other side thereof at a temperature of 70° C. under a pressure of 30 kg/cm² for 1 minute.

In FIG. 1, both the adhesive layers 3 and 4 had a thickness of 25 μm.

EXAMPLE 4

In the construction shown in FIG. 4, a polyethylene terephthalate film having a thickness of 350 μm was used as an internal material 21. The internal material 21 was coated with the same organic solvent type synthetic rubber adhesive as used in Example 1 above on both sides thereof. The coating film was then dried. Separately, a polyethylene terephthalate film having a thickness of 30 μm, which is about one fourth that of an insulating substrate of a flexible printed circuit board 1, was provided as an external material 22. The external material 22 was then hot-pressed to the synthetic rubber adhesive surface of the internal material 21 on one side thereof at a temperature of 70° C. under a pressure of 5 kg/cm² by means of a heated roller to obtain a reinforcement 2. During this process, the adhesive layer on the other side of the internal material 21 was protected by a silicone-treated polyester film. The reinforcement 2 was then provided with holes for accommodating electronic components. The silicone-treated polyester film was then peeled off the internal material 21. The printed surface of the flexible printed circuit board 1 was then hot-pressed to the synthetic rubber adhesive surface of the internal material 21 of the reinforcement 2 on the other side thereof at a temperature of 70° C. under a pressure of 30 kg/cm² for 1 minute.

EXAMPLE 5

A reinforced flexible printed circuit board was prepared in the same manner as in Example 4 except that a polyethylene terephthalate film having a thickness of 500 μm, which is four times that of the insulating substrate of the flexible printed circuit board, was used as the external material 22.

EXAMPLE 6

A reinforced flexible printed circuit board was prepared in the same manner as in Example 1 except that the polyethylene terephthalate film was replaced by a polyimide film (Kapton, available from Du Pont), the organic solvent type synthetic rubber adhesive was replaced by an epoxy rubber adhesive, and the bonding of the reinforcement to the flexible printed circuit board was effected at a temperature of 190° C. under a pressure of 50 kg/cm² for 1 minute.

COMPARATIVE EXAMPLE

A 350-μm thick polyethylene terephthalate film was used as a reinforcement. The reinforcement was then provided with holes for accommodating electronic components. The reinforcement was then hot-pressed to the printed surface of the flexible printed circuit board with the same organic solvent type synthetic rubber adhesive as used in Example 1 above at a temperature of 70° C. under a pressure of 30 kg/cm² for 1 minute.

The reinforced flexible printed circuit boards obtained in the above examples and comparative examples (10 samples in each example and comparative example) each was heated to a temperature of 110° C. in an oven for 15 minutes, allowed to stand at room temperature for 10 minutes, and then measured for warpage (deflection at the center of the width). (The reinforced flexible printed circuit was warped with the flexible printed circuit board being kept inside. The sample was placed on a horizontal table with the flexible printed circuit board facing upward. The height from the upper surface of the horizontal table to both the ends of the sample was measured. The two height values were averaged to determine the warpage.) As a result, Examples 1 to 3 each showed a warpage of 2 mm or less. Example 4 showed a warpage of 3.5 mmor less. Example 5 showed a warpage of 1.5 mm or less. Example 6 showed a warpage of 1.5 mm or less. Thus, these examples showed small warpage. On the contrary, all the comparative examples showed warpage of 12 mm or more.

In order to examine the effect of the area proportion of conductor on the flexible printed circuit board to the warpage, a reinforced flexible printed circuit board was prepared in the same manner as in the above examples except that the flexible printed circuit board on which a conductor circuit pattern had been formed by etching was replaced by an unetched copper foil-laminated polyethylene terephthalate film. These samples were measured for warpage in the same manner as above. As a result, a warpage rise of as small as 0.5 to 1.0 mm was shown. It was thus confirmed that even if the copper remained area on the flexible circuit board is increased, the flexible printed circuit board reinforced by the reinforcement of the present invention can still maintain the warpage small enough.

As described above, the present invention can provide a reinforced flexible printed circuit board which can be thoroughly prevented from being warped under severe temperature conditions. Electronic components can be smoothly assembled on the reinforced flexible printed circuit board by soldering (e.g., reflow process), since there is no warpage in the reinforced flexible printed circuit board and a good flat surface state can be maintained. Further, even if the copper remained area on the flexible printed circuit board varies, the effect of inhibiting warpage can be thoroughly maintained. Accordingly, one reinforcement can be used for flexible printed circuit boards having different copper remained areas. Thus, the required types of reinforcement materials can be reduced, that contributes to the improvement of production efficiency and inventory control.

While the invention has been described in detail and with reference to specific embodiments thereof, it will be apparent to one skilled in the art that various changes and modifications can be made therein without departing from the spirit and scope thereof.

What is claimed is:

1. A reinforcement which is used to adhere to a flexible printed circuit board, comprising an internal material having a bending neutral surface located at the center of the thickness thereof, and an external material having the same Young's modulus as that of an insulating substrate of the flexible printed circuit board, which is bonded to one side of the internal material, the other side of the internal material acting as an adhesive surface to the flexible printed circuit board.

2. The reinforcement as claimed in claim 1, wherein said internal material has a single-layer construction.

3. The reinforcement as claimed in claim 1, wherein said internal material has a multi-layer construction.

4. The reinforcement as claimed in claim 1, wherein said external material is made of the same material as that of said insulating substrate of the flexible printed circuit board.

5. The reinforcement as claimed in claim 2, wherein said external material is made of the same material as that of said insulating substrate of the flexible printed circuit board.

6. The reinforcement as claimed in claim 3, wherein said external material is made of the same material as that of said insulating substrate of the flexible printed circuit board.

7. The reinforcement as claimed in claim 1, wherein said external material has the same material and thickness as that of said insulating substrate of the flexible printed circuit board.

8. The reinforcement as claimed in claim 2, wherein said external material has the same material and thickness as that of said insulating substrate of the flexible printed circuit board.

9. The reinforcement as claimed in claim 3, wherein said external material has the same material and thickness as that of said insulating substrate of the flexible printed circuit board.

10. The reinforcement as claimed in claim 1, wherein said external material is made of the same material as that of said insulating substrate of the flexible printed circuit board and has a thickness different from that of said insulating substrate of the flexible printed circuit board, the ratio of the thickness of the external material to that of the insulating substrate being from 1:5 to 5:1.

11. The reinforcement as claimed in claim 2, wherein said external material is made of the same material as that of said insulating substrate of the flexible printed circuit board and has a thickness different from that of said insulating substrate of the flexible printed circuit board, the ratio of the thickness of the external material to that of the insulating substrate being from 1:5 to 5:1.

12. The reinforcement as claimed in claim 3, wherein said external material is made of the same material as that of said insulating substrate of the flexible printed circuit board and has a thickness different from that of said insulating substrate of the flexible printed circuit board, the ratio of the thickness of the external material to that of the insulating substrate being from 1:5 to 5:1.

13. A reinforced flexible printed circuit board comprising a flexible printed circuit board and the reinforcement as claimed in claim 1 adhered thereto.

14. A reinforced flexible printed circuit board comprising a flexible printed circuit board and the reinforcement as claimed in claim 2 adhered thereto.

15. A reinforced flexible printed circuit board comprising a flexible printed circuit board and the reinforcement as claimed in claim 3 adhered thereto.

16. A reinforced flexible printed circuit board comprising a flexible printed circuit board and the reinforcement as claimed in claim 4 adhered thereto.

17. A reinforced flexible printed circuit board comprising a flexible printed circuit board and the reinforcement as claimed in claim 5 adhered thereto.

18. A reinforced flexible printed circuit board comprising a flexible printed circuit board and the reinforcement as claimed in claim 6 adhered thereto.

19. A reinforced flexible printed circuit board comprising a flexible printed circuit board and the reinforcement as claimed in claim 7 adhered thereto.

20. A reinforced flexible printed circuit board comprising a flexible printed circuit board and the reinforcement as claimed in claim 8 adhered thereto.

21. A reinforced flexible printed circuit board comprising a flexible printed circuit board and the reinforcement as claimed in claim 9 adhered thereto.

22. A reinforced flexible printed circuit board comprising a flexible printed circuit board and the reinforcement as claimed in claim 10 adhered thereto.

23. A reinforced flexible printed circuit board comprising a flexible printed circuit board and the reinforcement as claimed in claim 11 adhered thereto.

24. A reinforced flexible printed circuit board comprising a flexible printed circuit board and the reinforcement as claimed in claim 12 adhered thereto.

* * * * *